(12) United States Patent
Shinkawata

(10) Patent No.: US 6,522,002 B1
(45) Date of Patent: Feb. 18, 2003

(54) SEMICONDUCTOR DEVICE AND METHOD OF MANUFACTURING THE SAME

(75) Inventor: Hiroki Shinkawata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/627,011

(22) Filed: Jul. 27, 2000

(30) Foreign Application Priority Data

Feb. 7, 2000 (JP) .......................................... 2000-029025

(51) Int. Cl.[7] .......................... H01L 23/48; H01L 23/52; H01L 29/40
(52) U.S. Cl. ........................ 257/757; 257/741; 257/754; 257/755; 257/768
(58) Field of Search ................................ 257/741, 754, 257/755, 757, 758, 760, 762, 763, 764, 766, 768, 769, 770, 773, 774

(56) References Cited

U.S. PATENT DOCUMENTS

| | | | |
|---|---|---|---|
| 5,162,262 A | * | 11/1992 | Ajika et al. .................. 438/649 |
| 5,559,047 A | * | 9/1996 | Urabe ......................... 438/301 |
| 5,604,145 A | * | 2/1997 | Hashizume et al. ......... 438/240 |
| 6,150,689 A | * | 11/2000 | Narui et al. ................. 257/306 |
| 6,215,144 B1 | * | 4/2001 | Saito et al. .................. 257/310 |

FOREIGN PATENT DOCUMENTS

| | | | |
|---|---|---|---|
| JP | 02040913 A | * | 2/1990 |
| JP | 6-61178 | | 3/1994 |
| JP | 11-219916 | | 8/1999 |

\* cited by examiner

*Primary Examiner*—George C. Eckert, II
*Assistant Examiner*—Chris C. Chu
(74) *Attorney, Agent, or Firm*—McDermott, Will & Emery

(57) ABSTRACT

In a semiconductor device, a $CoSi_2$ film is interposed between a pluglike contact and a barrier metal film as a silicide film. Consequently, excess reaction can be suppressed on a Ti/polysilicon interface between the pluglike contact or a pluglike local wire and the barrier metal film for stably lowering contact resistance.

10 Claims, 17 Drawing Sheets

JUNCTION LEAKAGE INCREASED

TRANSISTOR CHARACTERISTICS DETERIORATED

HIGH CONTACT RESISTANCE

HIGH CONTACT
RESISTANCE
HIGH LOCAL WIRE RESISTANCE

SEMICONDUCTOR DEVICE AND METHOD OF MANUFACTURING THE SAME

BACKGROUND OF THE INVENTION

1. Field of the Invention

The present invention relates to a semiconductor device such as a semiconductor memory device or a semiconductor memory-combined device having a pluglike contact hole or a pluglike local wire. In this case, the term "pluglike" indicates a state embedding a conductor in a hole or a groove communicating with an upper connected portion and a lower connected portion vertically separated from each other in a layer structure for electrically connecting the upper and lower connected portions with each other as shown in FIG. 17A.

2. Description of the Background Art

In recent years, a semiconductor device such as a DRAM (dynamic random access memory) is so increasingly refined that high overlay accuracy is required as to both of a bit line contact and a capacitor contact in a memory cell following reduction of the cell area, and hence self-aligned contacts (SAC) must be employed.

In a COB (capacitor over bit-line) structure forming the mainstream at present, a capacitor contact must be self-aligned with respect to both of a gate electrode and a bit line. However, the depth of the capacitor contact is about 1 μm in general and hence it is technically difficult to form an opening for both of the gate electrode and the bit line through single SAC etching. In a current advanced device, therefore, an SAC opening is first formed through a stopper layer 8 formed by a silicon nitride film, as shown in FIG. 7. Referring to FIG. 8, a part of the stopper layer 8 covering a source/drain region 2 at the bottom of the opening is removed by anisotropic etching for forming a vertical hole communicating with a lower connected portion. Referring to FIG. 9, the vertical hole is filled up with polysilicon thereby forming a pluglike contact 9 as the so-called "lift contact". Then, a bit line contact 12 or a capacitor contact 16 reduced in diameter is formed to be connected onto the pluglike contact 9. FIGS. 17A to 18B show exemplary structures formed in the aforementioned manner.

Referring to FIG. 17A, the source/drain region 2 is connected with a it line 14 in a memory cell part. FIG. 17A is a sectional view, and FIG. 17B illustrates the positional relation as viewed from above. This also applies to the remaining figures subscripted with "A" and "B" respectively. FIGS. 17A and 17B show a semiconductor device including a gate oxide film 3, gate electrode side wall oxide films 5, a gate electrode 4, an LDD spacer 6, a mask oxide film 7, the stopper layer 8, the pluglike contact 9 and interlayer isolation films 10a and 10b, which are formed on a silicon substrate 50. The silicon substrate 50 includes element isolation regions 1 and the source/drain region 2. The bit line contact 12 is formed on the pluglike contact 9 through a barrier metal film 13. The bit line contact 12 extends downward from the bit line 14 formed on the interlayer isolation film 10b through the barrier metal film 13 for implementing downward electrical connection.

Referring to FIGS. 18A and 18B, the source/drain region 2 is connected with a capacitor lower electrode 18 in a capacitor part. While components located under an interlayer isolation film 10a in FIGS. 18A and 18B are similar to those shown in FIGS. 17A and 17B, an interlayer isolation film 10c and a capacitor isolation film 20 are formed on the interlayer isolation film 10a. The capacitor lower electrode 18 is formed on the interlayer isolation film 10c through a barrier metal film 13. A capacitor upper electrode 22 is formed on the capacitor lower electrode 18 through a capacitor dielectric film 21.

Thus, the contact is formed in a multi-step manner for reducing the depth of a hole formed at a time so that the capacitor contact 16 can be formed with a small diameter and a large depth.

In a most advanced DRAM, the bit line 14 shown in FIGS. 17A and 17B or FIGS. 19A and 19B is prepared from a low-resistance material such as W, in order to satisfy requirement for lowering the resistance value thereof. When the capacitor dielectric film 21 shown in FIGS. 18A and 18B is formed by a film of a material having a high dielectric constant such as $Ta_2O_5$, a metal material such as W resistant against oxidation is conceivably employed also for the capacitor lower electrode 18.

The material for the aforementioned pluglike contact 9 is prepared from polysilicon in consideration of affinity to silicon in heat treatment. The barrier metal film 13 consists of a two-layer structure of Ti and TiN with the layer of Ti closer to the silicon substrate 50. Therefore, the contact part has a film structure of W, TiN, Ti and polysilicon in descending order. In this case, reaction of forming TiSi takes place on the Ti/polysilicon interface in the wafer process, to increase contact resistance by excess reaction depending on heat treatment conditions. In this structure, it is difficult to attain stable low contact resistance.

Accordingly, an object of the present invention is to provide a semiconductor device having a pluglike contact capable of suppressing excess reaction on a Ti/polysilicon interface and stably lowering contact resistance.

When forming the aforementioned pluglike contact 9, it is possible to simultaneously form a pluglike local wire 24 shown in FIGS. 22A and 22B. The term "pluglike local wire" indicates a local wire consisting of a conductor filling up a groove communicating with an upper connected portion and a lower connected portion. Provision of the pluglike local wire is effective in a portion such as a DRAM array part having no allowance in a space for laying out a general local wire. In general, however, the pluglike local wire of polysilicon disadvantageously has a higher resistance value than the general local wire.

Accordingly, another object of the present invention is to provide a semiconductor device capable of stably lowering the resistance value of a pluglike local wire.

In each of a peripheral circuit part and a logic circuit part of a DRAM, a contact 27 and a $CoSi_2$ film 11 is formed on a source/drain region 2 of a transistor as shown in FIG. 20A, for forming a low-resistance contact. However, the $CoSi_2$ film 11 may be heterogeneously formed on the source/drain region 2 due to a factor such as heat treatment. In this case, junction leakage is disadvantageously increased.

Further, $CoSi_2$ may abnormally diffuse under an LDD (lightly doped drain) spacer 6 bounding on the transistor. In this case, the transistor characteristics are disadvantageously deteriorated.

Accordingly, still another object of the present invention is to provide a semiconductor device comprising a pluglike local wire, yet having a low resistance value.

A gate electrode contact 28 shown in FIGS. 21A and 21B is formed with no $CoSi_2$ film 11 shown in FIG. 20A but a bit line 14 is directly in contact with a gate electrode 4 only through a barrier metal film 13, in order to avoid a complicated process. Thus, the gate electrode contact 28 disadvantageously has relatively high contact resistance.

Accordingly, a further object of the present invention is to provide a semiconductor device capable of stably implementing low resistance in a gate electrode contact.

SUMMARY OF THE INVENTION

In order to attain the aforementioned objects, a semiconductor device according to the present invention comprises an upper connected portion, which is an upper conductor portion, having a lower surface covered with a barrier metal film, a lower connected portion which is a lower conductor portion and a connecting portion for electrically connecting the barrier metal film and the lower connected portion with each other, and a layer essentially consisting of silicide having resistivity of not more than 100 $\mu\Omega\cdot$cm is provided between the connecting portion and the barrier metal film to cover the upper surface of the connecting portion.

The connecting portion and the barrier metal film are not directly in contact with each other due to the aforementioned structure. Thus, the connecting portion does not react with the barrier metal film also when the same is made of polysilicon or the like, while the silicide layer has a low resistance value and hence contact resistance can be stably lowered.

Preferably, the connecting portion includes a conductor embedded in a hole communicating with the upper connected portion and the lower connected portion. Also when the connecting portion is formed by the so-called pluglike contact, the contact resistance can be stably lowered due to this structure.

Preferably, the upper connected portion includes a bit line contact. The contact resistance between the bit line contact and a pluglike contact in a memory cell can be stably lowered due to this structure.

Preferably, the upper connected portion includes a capacitor contact. The contact resistance between the capacitor contact and the pluglike contact in the memory cell can be stably lowered due to this structure.

Preferably, the lower end of the connecting portion is directly connected to a source or drain region provided on a semiconductor substrate without through a silicide film. It is possible to prevent junction leakage to the source/drain region caused when the silicide film is homogeneous, due to this structure.

Preferably, the lower end of the connecting portion is directly connected to a gate electrode. Excess reaction between the gate electrode and the barrier metal film can be prevented due to this structure.

Preferably, the connecting portion is a local wire formed by a conductor filing up a groove communicating with the upper connected portion and the lower connected portion. In a semiconductor device comprising the so-called pluglike local wire, the pluglike local wire does not react with the barrier metal film also when the same is made of polysilicon or the like, while the silicide layer has a low resistance value and hence the contact resistance can be stably lowered due to this structure.

Preferably, the silicide is any material selected from a group consisting of $CoSi_2$, $TiSi_2$, $NiSi_2$, PdSi, ZrSi, HfSi, PtSi, CuSi, AuSi and AgSi. A layer of silicide having low resistivity can be formed for stably lowering the contact resistance due to this structure.

A method of manufacturing a semiconductor device according to the present invention comprises a metal film forming step of forming a metal film on the upper surface of a connecting portion containing polysilicon electrically connected to a lower connected portion for electrically connecting the lower connected portion with an upper connected portion, a silicification step of heat-treating the metal film and the connecting portion for causing silicification between the metal film and the connecting portion thereby forming a silicide film, a metal film removing step of removing a part of the metal film not silicified in the silicification step, an interlayer isolation film forming step of forming an interlayer isolation film to cover the silicide film, a perforation step of providing a vertical hole communicating with the silicide film in the interlayer isolation film and a wire forming step of forming a wire portion including a conductor in the vertical hole and on the interlayer isolation film.

The connecting portion and a barrier metal film are in contact with each other not directly but through the silicide film due to the aforementioned structure. Thus, the connecting portion does not react with the barrier metal film while the silicide layer has a low resistance value and hence a semiconductor device stably exhibiting low contact resistance can be manufactured.

Preferably, the silicide film consists of any material selected from a group consisting of $CoSi_2$, $TiSi_2$, $NiSi_2$, PdSi, ZrSi, HfSi, PtSi, CuSi, AuSi and AgSi. A silicide layer having low resistivity can be formed for stably lowering the contact resistance due to this structure.

The foregoing and other objects, features, aspects and advantages of the present invention will become more apparent from the following detailed description of the present invention when taken in conjunction with the accompanying drawings.

Figure 1A:
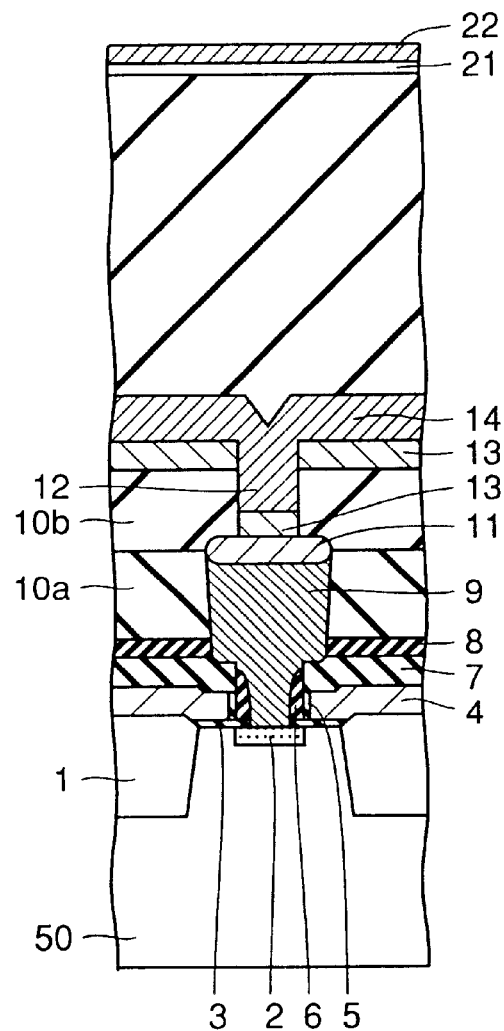
FIG. 1A is a sectional view of a semiconductor device according to a first embodiment of the present invention.

DESCRIPTION OF THE PREFERRED EMBODIMENTS (First Embodiment)

In general, the barrier metal film 13 is directly in contact with the pluglike contact 9, as shown in each of FIGS. 17A to 19B. In a semiconductor device according to a first embodiment of the present invention, a $CoSi_2$ film 11 is formed on a pluglike contact 9, as shown in each of FIGS. 1A, 2A and 3A. The remaining parts of the semiconductor device shown in FIGS. 1A to 3B identical or corresponding to those shown in FIGS. 17A to 19B are denoted by the same reference numerals.

Figure 1B:
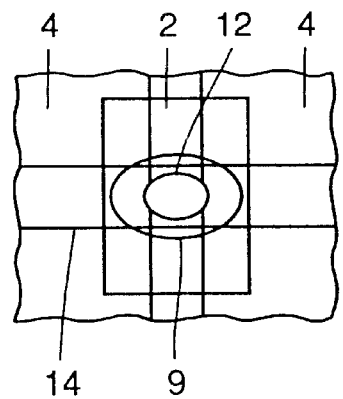
FIG. 1B illustrates the positional relation between respective parts of the semiconductor device as viewed from above.

Referring to FIGS. 1A and 1B, the pluglike contact 9 connects a bit line 14, serving as an upper connected portion, having a bit line contact 12 with a transistor serving as a lower connected portion in a memory cell part.

Figure 2A:
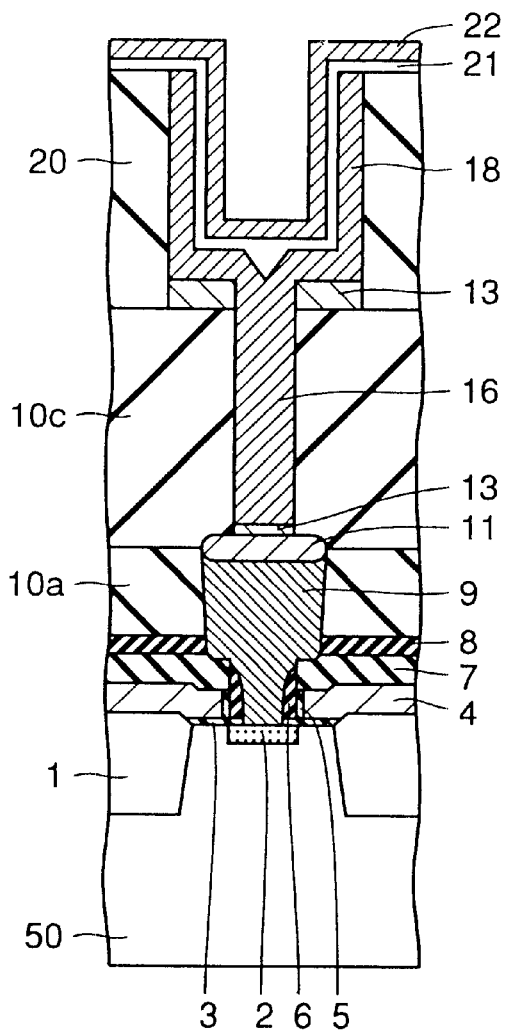
FIG. 2A is a sectional view of the semiconductor device according to the first embodiment of the present invention.
Figure 2B:
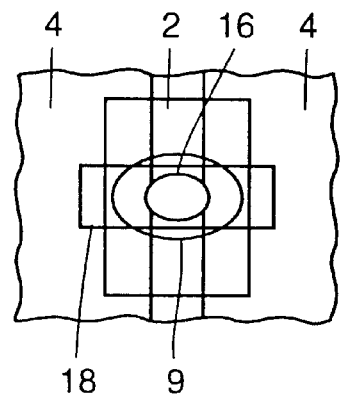
FIG. 2B illustrates the positional relation between the respective parts of the semiconductor device as viewed from above.

Referring to FIGS. 2A and 2B, the pluglike contact 9 connects a capacitor, serving as an upper connected portion, having a capacitor contact 16 with a transistor serving as a lower connected portion in a capacitor part.

Figure 3A:
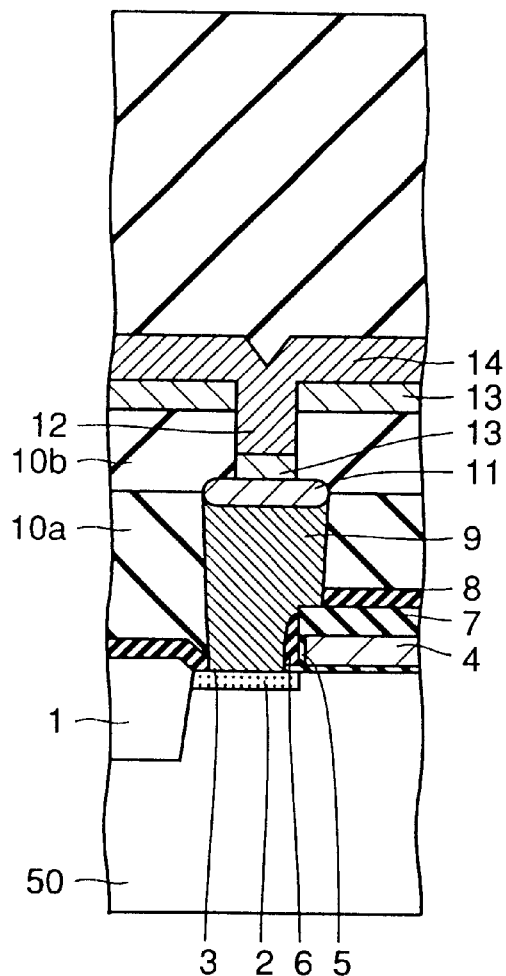
FIG. 3A is a sectional view of the semiconductor device according to the first embodiment of the present invention.
Figure 3B:
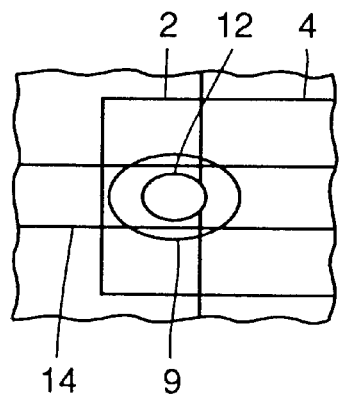
FIG. 3B illustrates the positional relation between the respective parts of the semiconductor device as viewed from above.

Referring to FIGS. 3A and 3B, the pluglike contact 9 connects the bit line 14, serving as an upper connected portion, having the bit line contact 12 with a source/drain region 2 serving as a lower connected portion in a peripheral circuit part or a logic circuit part.

A method of manufacturing the structure shown in FIGS. 1A and 1B is now described particularly with reference to steps around formation of the $COSi_2$ film 11.

Figure 9:
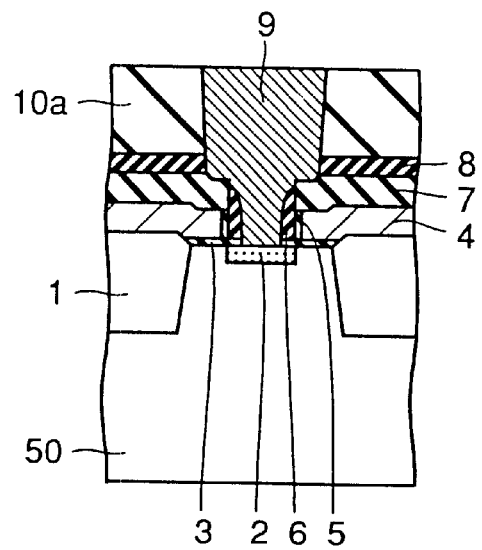
Figure 10:
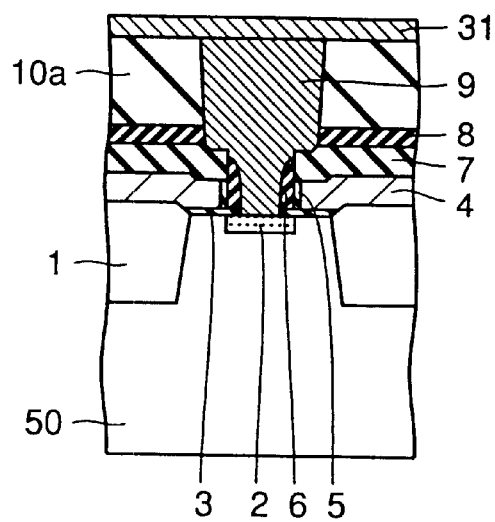
FIGS. 10 to 16 are sectional views showing first to seventh steps of manufacturing the semiconductor device according to the first embodiment of the present invention.
Figure 11:
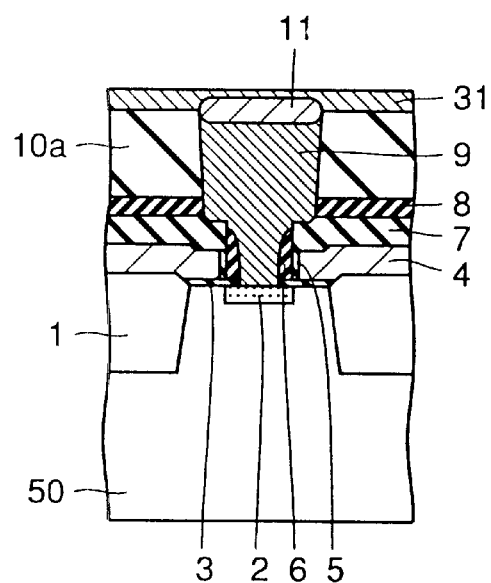
Figure 12:
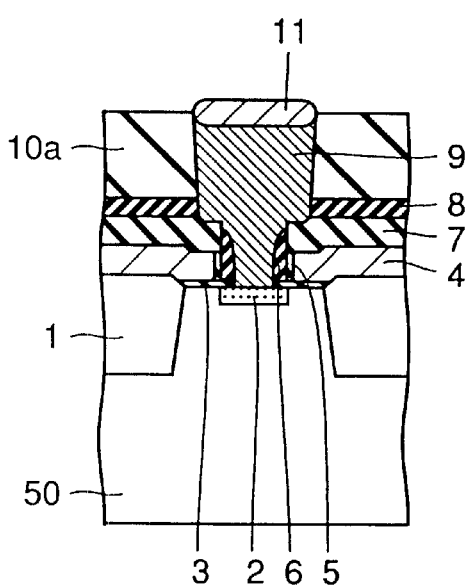
Figure 13:
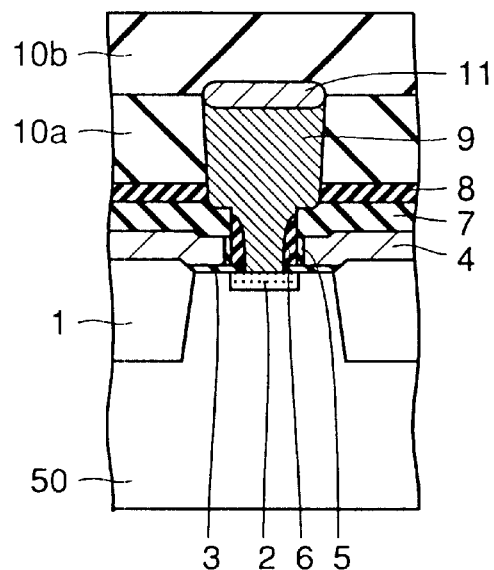
Figure 14:
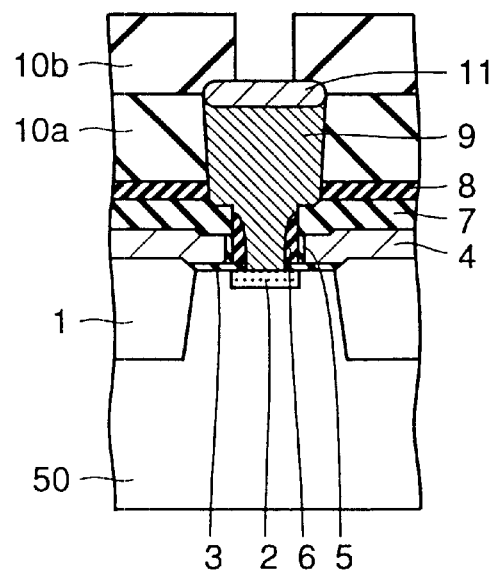
Figure 15:
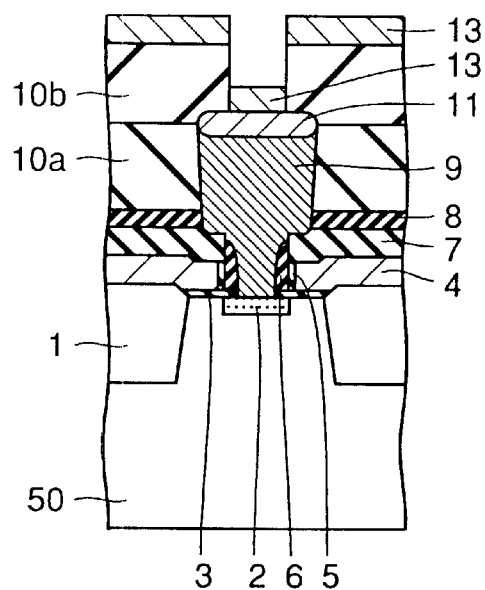
Figure 16:
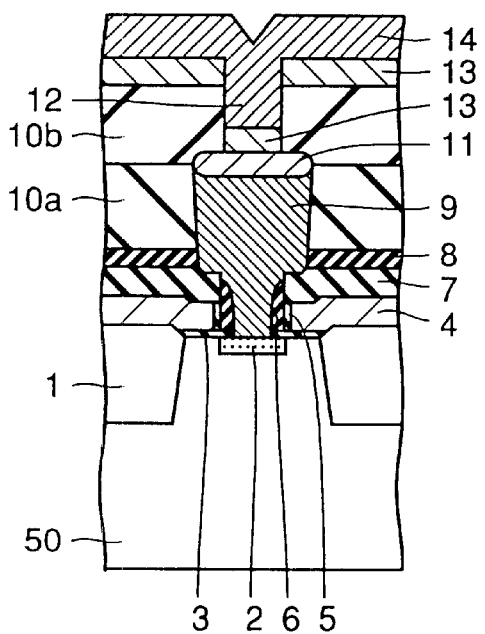
Figure 17A:
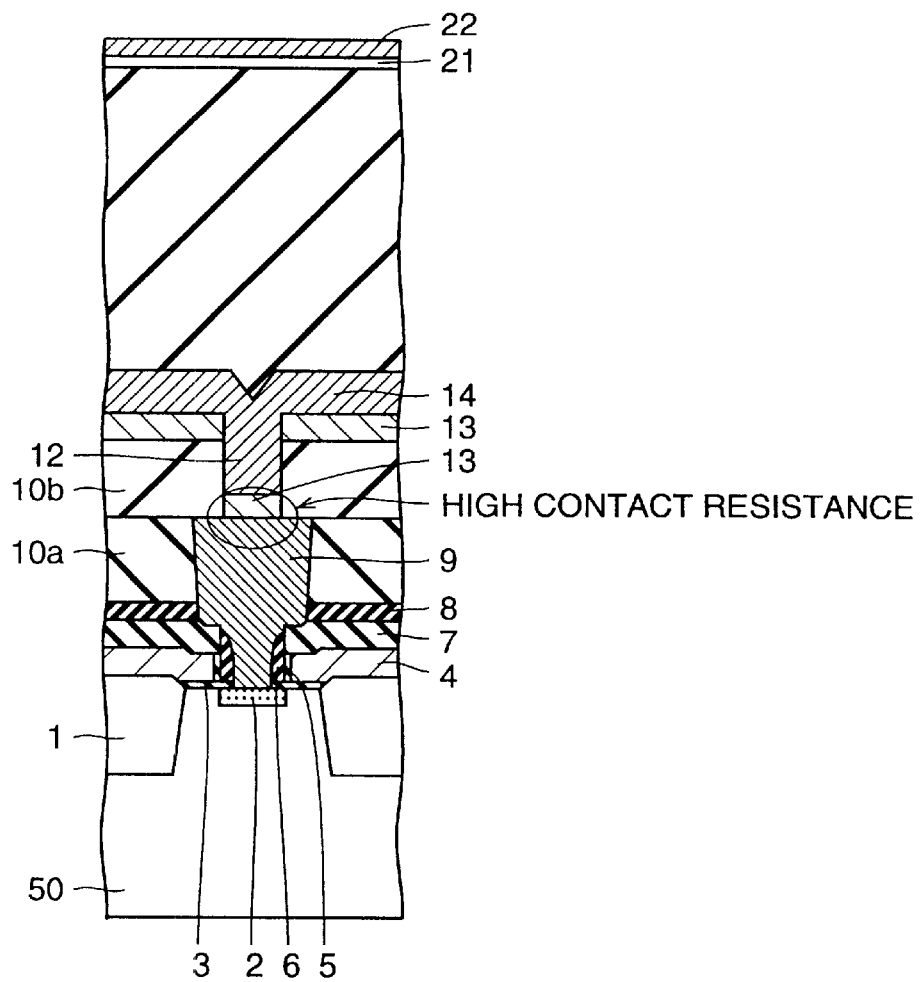
FIG. 17A is a sectional view of a memory cell part of a conventional semiconductor device with a pluglike contact connecting a gate electrode and a bit line with each other.
Figure 17B:
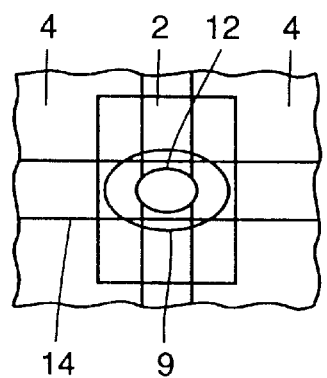
FIG. 17B illustrates the positional relation between respective parts of the conventional semiconductor device as viewed from above.
Figure 18A:
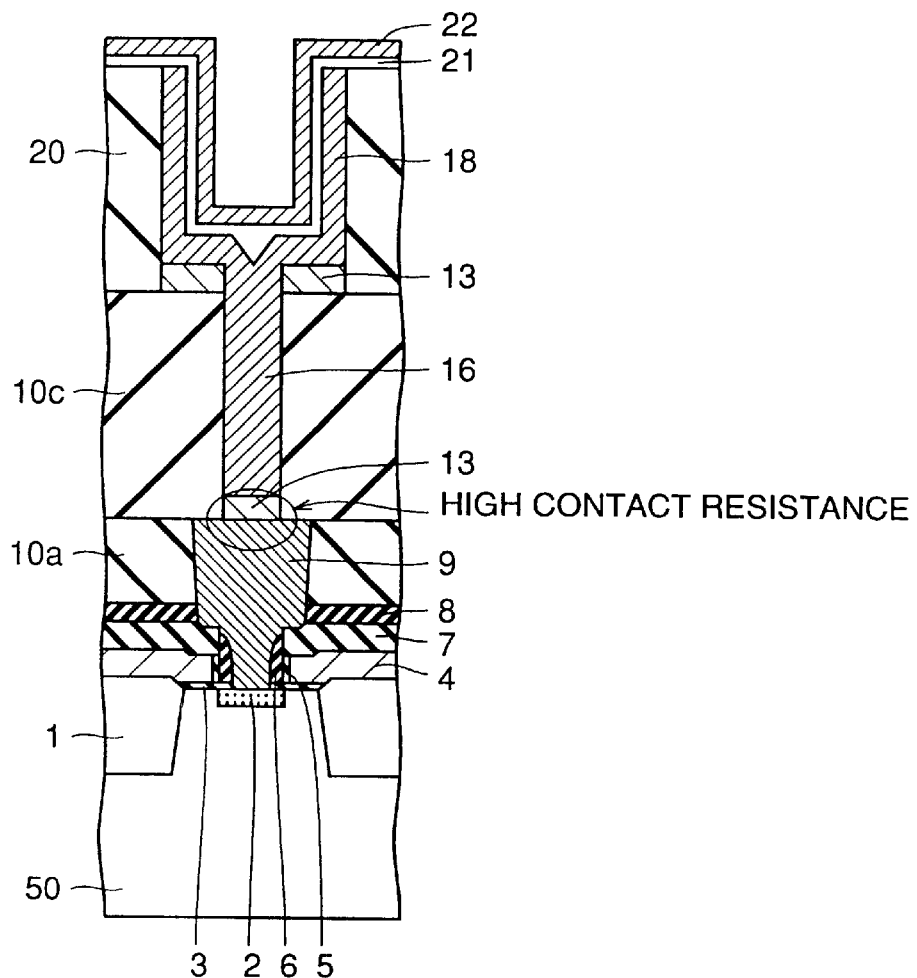
FIG. 18A is a sectional view of a capacitor part of the conventional semiconductor device with the pluglike contact connecting the gate electrode and a capacitor lower electrode with each other.
Figure 18B:
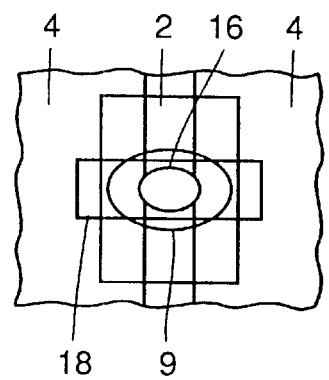
FIG. 18B illustrates the positional relation between the respective parts of the conventional semiconductor device as viewed from above.
Figure 19A:
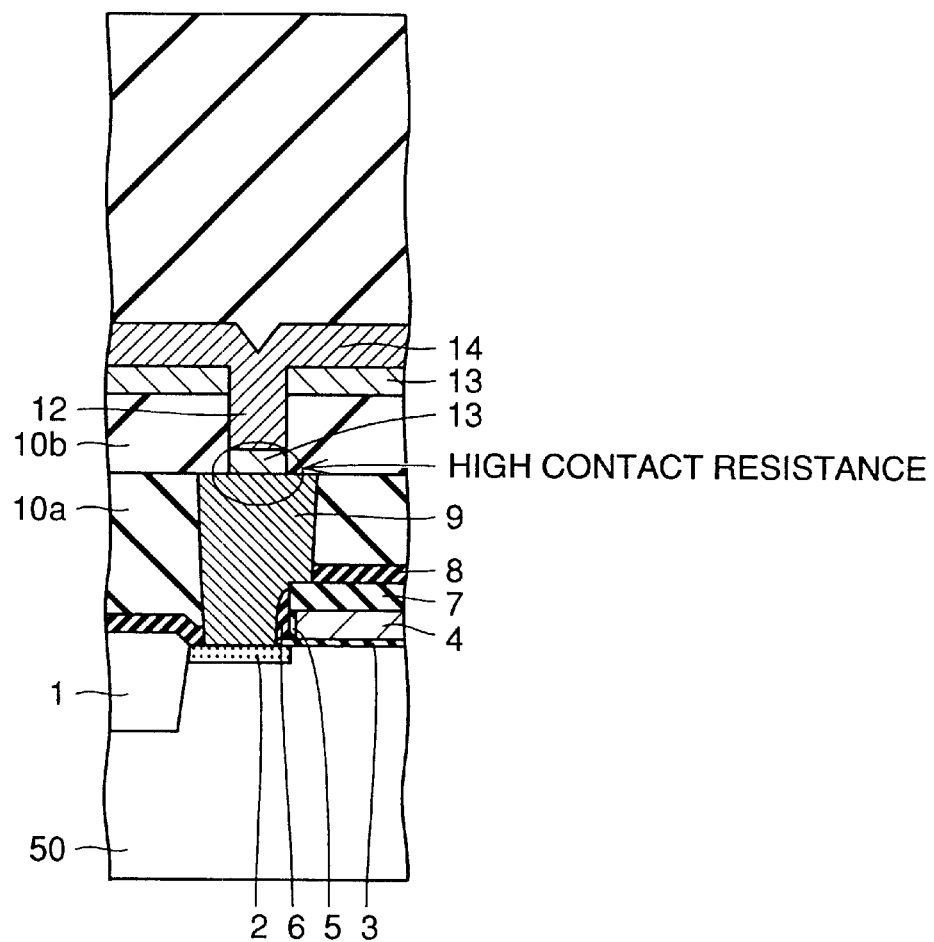
FIG. 19A is a sectional view of a peripheral circuit part or a logic circuit part of the conventional semiconductor device with the pluglike contact connecting the gate electrode and the bit line with each other.
Figure 19B:
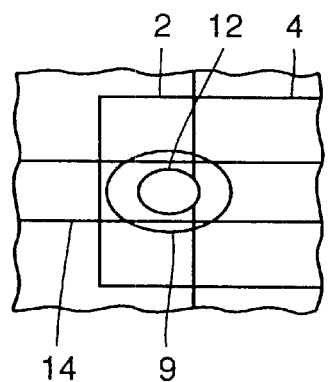
FIG. 19B illustrates the positional relation between the respective parts of the conventional semiconductor device as viewed from above.

Steps up to that of forming the pluglike contact 9 shown in FIG. 9 are identical to those of forming the conventional structure. Referring to FIG. 10, a cobalt film 31 is formed on the upper surface of the structure shown in FIG. 9 by a film forming method such as sputtering. While the cobalt film 31 is employed for forming the $CoSi_2$ film 11 as a silicide film, another metal film may be properly employed in order to form another type of silicide film. Referring to FIG. 11, heat treatment is performed for causing silicification between the metal and silicon. Consequently, the $CoSi_2$ film 11 is formed on a part of the cobalt film 31 in contact with the pluglike contact 9. Referrng to FIG. 12, the remaining part of the cobalt film 31 is removed by wet etching. Referring to FIG. 13, an interlayer isolation film 10b is formed on an interlayer isolation film 10a and the $CoSi_2$ film 11. Referring to FIG. 14, a vertical hole for forming the bit line contact 12 is formed in the interlayer isolation film 10b. Referring to FIG. 15, a barrier metal film 13 is formed by sputtering or CVD (chemical vapor deposition). The barrier metal film 13 is formed by first forming a Ti layer and then forming a TiN layer. The barrier metal film 13, shown as a single layer in FIG. 15, has a two-layer structure of the Ti layer and the TiN layer. Referring to FIG. 16, the bit line 14 is formed on the interlayer isolation film 10b and in the vertical hole by sputtering or CVD. Subsequent steps are identical to those in the prior art.

The structure shown in FIGS. 2A and 2B or 3A and 3B can also be manufactured through similar steps around the step of forming the $CoSi_2$ film 11.

The pluglike contact 9 consisting of polysilicon and the barrier metal film 13 consisting of Ti/TiN are not directly in contact with each other due to the aforementioned structure, whereby excess reaction between Ti and polysilicon can be prevented. Further, the $CoSi_2$ film 11 has low resistivity of several 10 $\mu\Omega\cdot$cm and hence contact resistance can be stably lowered.

(Second Embodiment)

Figure 6A:
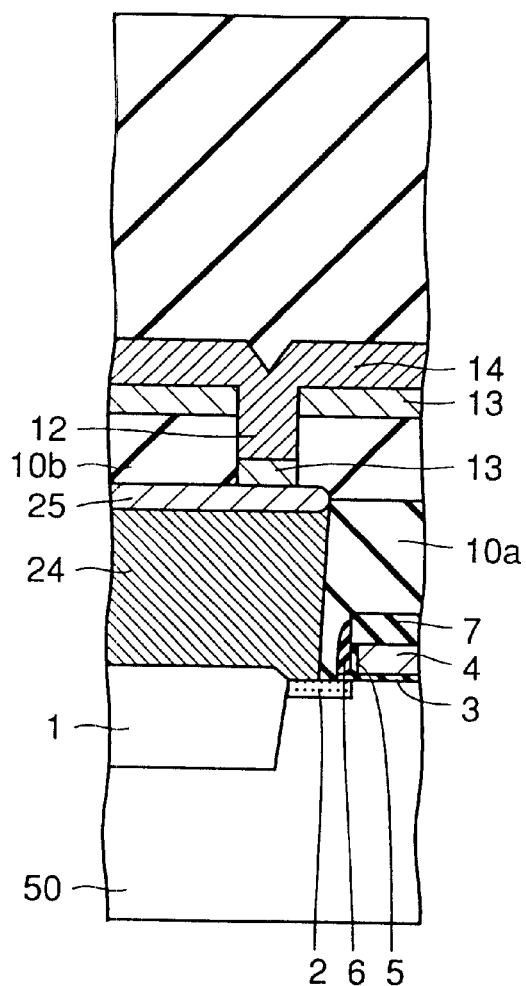
FIG. 6A is a sectional view of a semiconductor device according to a second embodiment of the present invention.
Figure 6B:
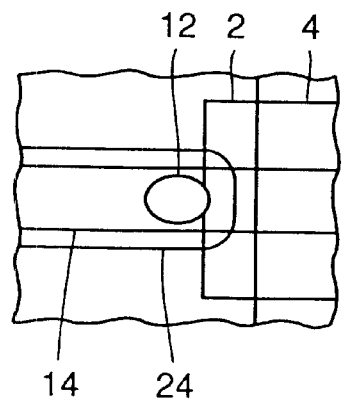
FIG. 6B illustrates the positional relation between respective parts of the semiconductor device as viewed from above.
Figure 7:
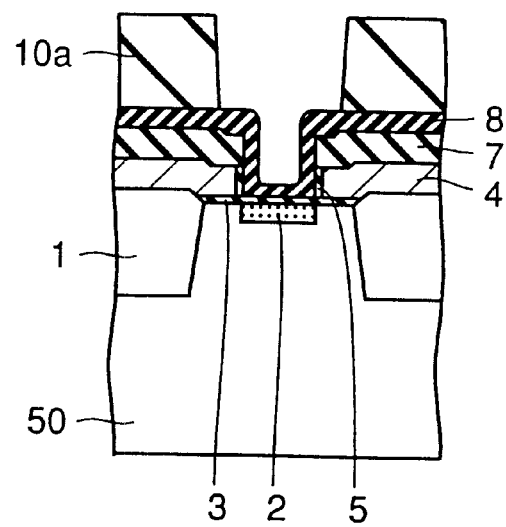
FIGS. 7 to 9 are sectional views showing first to third steps of forming a pluglike contact.
Figure 8:
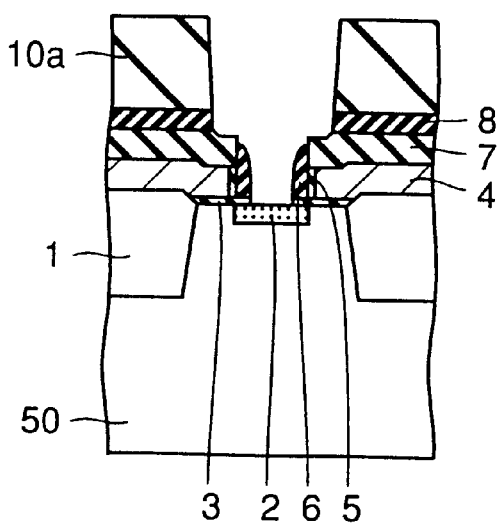
Figure 22A:
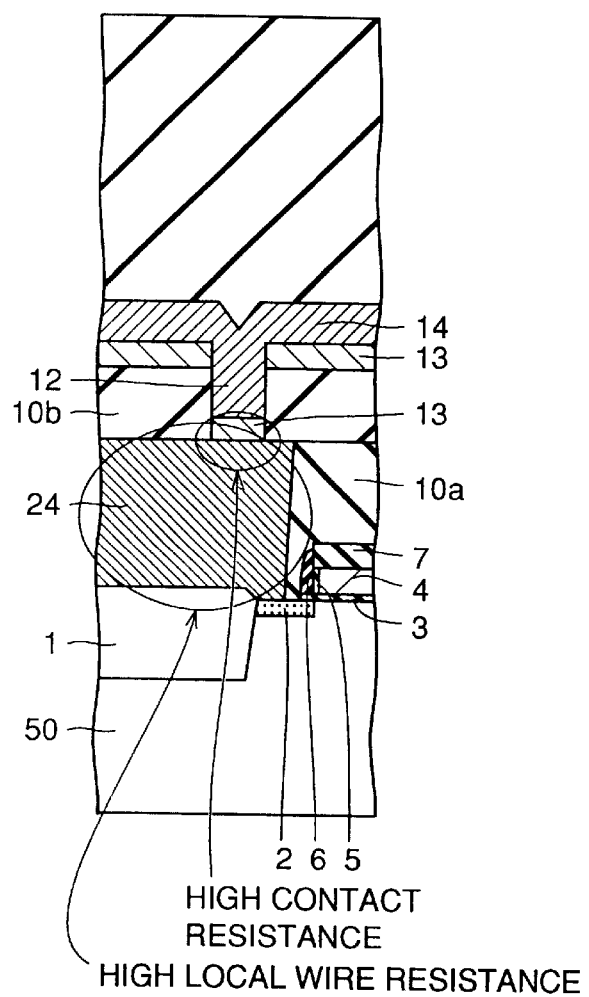
FIG. 22A is a sectional view of a pluglike local wire formed according to the prior art.
Figure 22B:
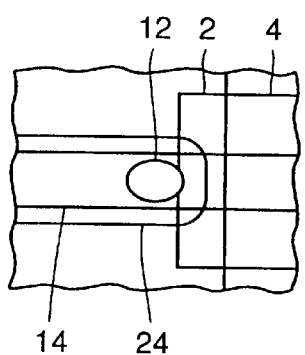
FIG. 22B illustrates the positional relation between respective parts as viewed from above.

In general, the barrier metal film 13 and the pluglike contact 9 are directly in contact with each other as shown in FIG. 22A. According to a second embodiment of the present invention, a $CoSi_2$ film 25 is provided on a pluglike local wire 24, as shown in FIG. 6A. As to the remaining structure shown in FIGS. 6A and 6B, parts identical or corresponding to those in FIGS. 22A and 22B are denoted by the same reference numerals.

The pluglike local wire 24 consisting of polysilicon and a barrier metal film 13 consisting of Ti/TiN are not directly in contact with each other due to the aforementioned structure, whereby excess reaction between Ti and polysilicon can be prevented. Further, the $CoSi_2$ film 25 has low resistivity of several 10 $\mu\Omega\cdot$cm and hence the resistance value of the pluglike local wire can be stably lowered.

(Third Embodiment)

Figure 4A:
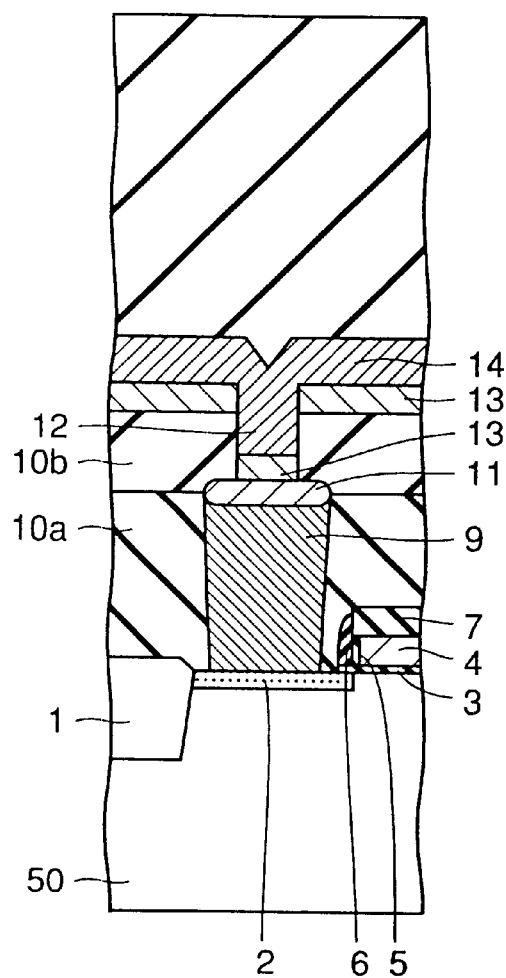
FIG. 4A is a sectional view of a semiconductor device according to a third embodiment of the present invention.
Figure 4B:
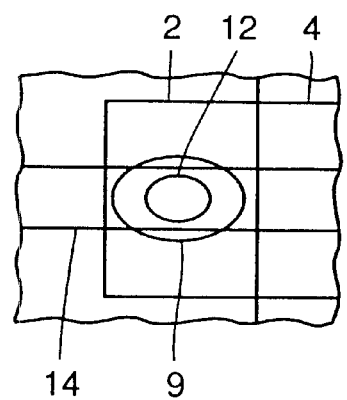
FIG. 4B illustrates the positional relation between respective parts of the semiconductor device as viewed from above.
Figure 20A:
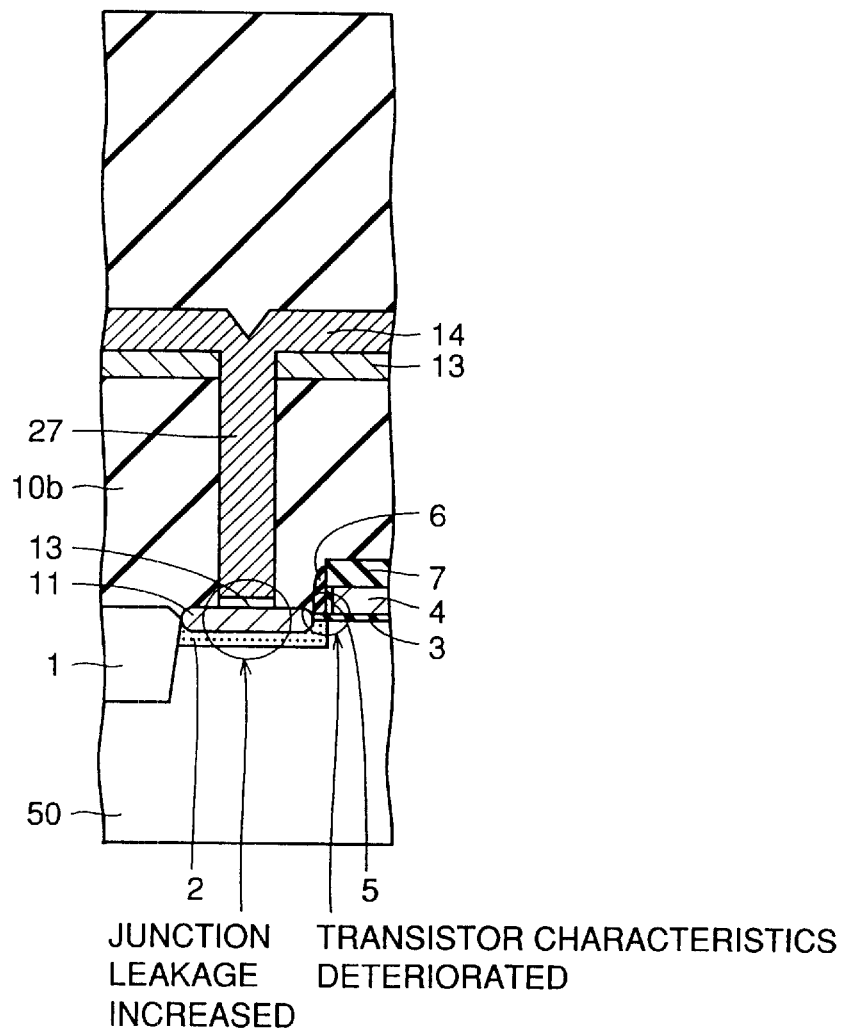
FIG. 20A is a sectional view of the peripheral circuit part or the logic circuit part of the conventional semiconductor device with a bit line contact connecting a source/drain region and the bit line with each other.
Figure 20B:
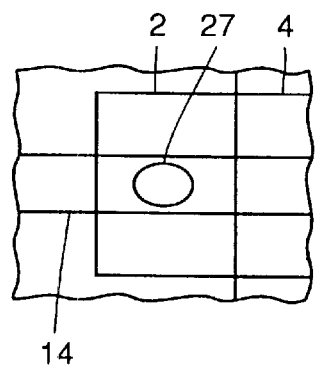
FIG. 20B illustrates the positional relation between the respective parts of the conventional semiconductor device as viewed from above.

In general, the $CoSi_2$ film 11 is directly formed on the source/drain region 2 in order to connect the source/drain region 2 with the bit line 14, as shown in FIG. 20A. According to a third embodiment of the present invention, a pluglike contact 9 is provided on a source/drain region 2 while a $CoSi_2$ film 11 is provided not under but on the pluglike contact 9, as shown in FIG. 4A. As to the remaining structure shown in FIGS. 4A and 4B, parts identical or corresponding to those shown in FIGS. 20A and 20B are denoted by the same reference numerals.

The $CoSi_2$ film 11 is not directly formed on the source/drain region 2 so that junction leakage to the source/drain region 2 can be prevented even if the $CoSi_2$ film 11 is heterogeneously formed. Further, the CoSi$_2$ film 11 can be separated from an LDD (lightly doped drain) spacer 6 bounding on a transistor, whereby the transistor can be prevented from deterioration of characteristics caused by abnormal diffusion of CoSi$_2$ under the LDD layer 6.

(Fourth Embodiment)

Figure 5A:
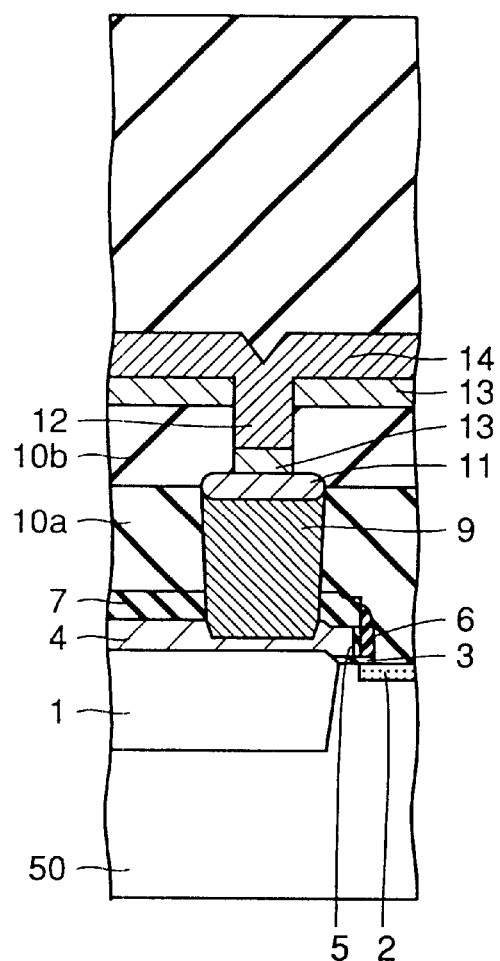
FIG. 5A is a sectional view of a semiconductor device according to a fourth embodiment of the present invention.
Figure 5B:
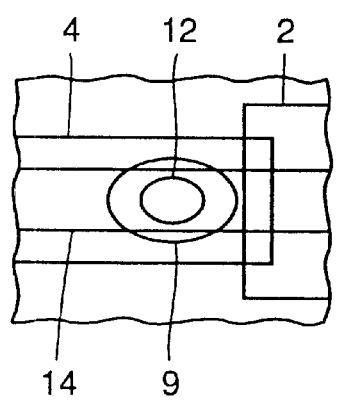
FIG. 5B illustrates the positional relation between respective parts of the semiconductor device as viewed from above.
Figure 21A:
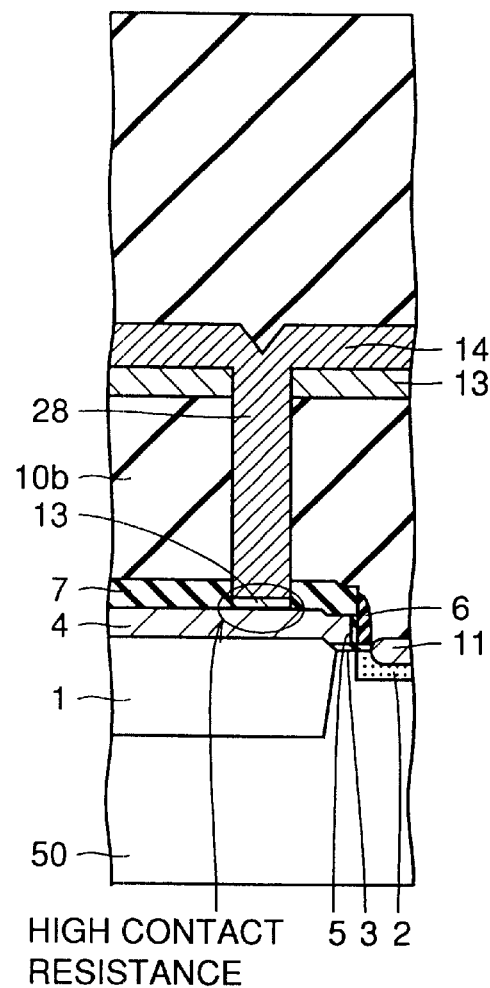
FIG. 21A is a sectional view of the peripheral circuit part or the logic circuit part of the conventional semiconductor device with a gate electrode contact connecting the source/drain region and the bit line with each other.
Figure 21B:
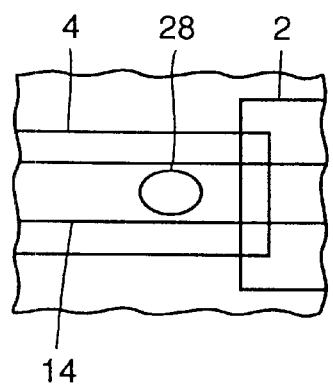
FIG. 21B illustrates the positional relation between the respective parts of the conventional semiconductor device as viewed from above.

In general, the barrier metal film 13 is directly in contact with the upper portion of the gate electrode 4 in order to connect the bit line 14 and the gate electrode 4, as shown in FIG. 21A. According to a fourth embodiment of the present invention, a pluglike contact 9 is provided on a gate electrode 4 while a CoSi$_2$ film 11 is provided on the pluglike contact 9, as shown in FIG. 5A. As to the remaining structure shown in FIGS. 5A and 5B, parts identical or corresponding to those shown in FIGS. 21A and 21B are denoted by the same reference numerals.

The gate electrode 4 and a barrier metal film 13 consisting of Ti/TiN are not directly in contact with each other due to the aforementioned structure, whereby excess reaction between Ti and the gate electrode 4 can be prevented. Further, the CoSi$_2$ film 11 has low resistivity of several 10 $\mu\Omega\cdot$cm and hence contact resistance can be stably lowered.

In each of the aforementioned embodiments, the CoSi$_2$ film 11 or 25 may be replaced with another silicide film so far as the resistivity thereof is not more than 100 $\mu\Omega\cdot$cm, to attain a similar effect due to the resistivity sufficiently lower than that of polysilicon. In particular, a silicide film having a low resistance value can be preferably obtained by employing any material selected from a group consisting of CoSi$_2$, TiSi$_2$, NiSi$_2$, PdSi, ZrSi, HfSi, PtSi, CuSi, AuSi and AgSi.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising the discrete elements of:
   a lower connected portion being a lower conductor portion;
   a connecting portion electrically connected with said lower connected portion;
   a layer essentially consisting of silicide having resistivity of not more than 100 $\mu\Omega$.cm is provided to cover the upper surface of said connecting portion;
   an interlayer isolation film covering the layer essentially consisting of silicide, the interlayer isolation film including a vertical hole connecting with the layer essentially consisting of silicide;
   a barrier metal film over the layer essentially consisting of silicide and electrically connected with the connecting portion; and
   an upper connected portion having a lower surface covered with the barrier metal film, the upper connected portion including a wire portion in said vertical hole and an upper conductor portion.

2. The semiconductor device according to claim 1, wherein said connecting portion includes a conductor embedded in a hole communicating with said upper connected portion and said lower connected portion.

3. The semiconductor device according to claim 2, wherein said upper connected portion includes a bit line contact.

4. The semiconductor device according to claim 2, wherein said upper connected portion includes a capacitor contact.

5. The semiconductor device according to claim 2, wherein the lower end of said connecting portion is directly connected to a source or drain region provided on a semiconductor substrate without through a silicide film.

6. The semiconductor device according to claim 2, wherein the lower end of said connecting portion is directly connected to a gate electrode.

7. The semiconductor device according to claim 1, wherein said connecting portion is a local wire formed by a conductor filling up a groove communicating with said upper connected portion and said lower connected portion.

8. The semiconductor device according to claim 1, wherein said silicide is any material selected from a group consisting of CoSi$_2$, TiSi$_2$, NiSi$_2$, PdSi, ZrSi, HfSi, PtSi, CuSi, AuSi and AgSi.

9. A method of manufacturing a semiconductor device comprising:
   a metal film forming step of forming a metal film on the upper surface of a connecting portion containing polysilicon electrically connected to a lower connected portion for electrically connecting said lower connected portion with an upper connected portion;
   a silicification step of heat-treating said metal film and said connecting portion for causing silicification between said metal film and said connecting portion thereby forming a silicide film;
   a metal film removing step of removing a part of said metal film not silicified in said silicification step;
   an interlayer isolation film forming step of forming an interlayer isolation film to cover said silicide film;
   a perforation step of providing a vertical hole in said interlayer isolation film, said vertical hole connecting with said silicide film; and
   a wire foing step of forming a wire portion including a conductor in said vertical hole and on said interlayer isolation film.

10. The method of manufacturing a semiconductor device according to claim 9, wherein said silicide film consists of any material selected from a group consisting of CoSi$_2$, TiSi$_2$, NiSi$_2$, PdSi, ZrSi, HfSi, PtSi, CuSi, AuSi and AgSi.

* * * * *